(12) United States Patent
Lee et al.

(10) Patent No.: US 11,251,651 B2
(45) Date of Patent: Feb. 15, 2022

(54) LIGHT-EMITTING SIGN DEVICE AND LOW-POWER PREDICTIVE DIAGNOSIS BIDIRECTIONAL ADAPTIVE CONTROL SYSTEM COMPRISING SAME

(71) Applicant: ALTECH CO.,LTD., Daegu (KR)

(72) Inventors: Ki Hoon Lee, Daegu (KR); Sung Su Jo, Daegu (KR)

(73) Assignee: ALTECH CO., LTD., Dalseo-gu (KR)

( * ) Notice: Subject to any disclaimer, the term of this patent is extended or adjusted under 35 U.S.C. 154(b) by 0 days.

(21) Appl. No.: 17/251,178

(22) PCT Filed: Apr. 19, 2019

(86) PCT No.: PCT/KR2019/004788
§ 371 (c)(1),
(2) Date: Dec. 10, 2020

(87) PCT Pub. No.: WO2020/004796
PCT Pub. Date: Jan. 2, 2020

(65) Prior Publication Data
US 2021/0218272 A1    Jul. 15, 2021

(30) Foreign Application Priority Data
Jun. 25, 2018  (KR) .......................... 10-2018-0072971

(51) Int. Cl.
*H02J 9/06* (2006.01)
*H02J 7/00* (2006.01)
(Continued)

(52) U.S. Cl.
CPC .......... *H02J 9/065* (2013.01); *G01R 19/2503* (2013.01); *G01R 31/3835* (2019.01);
(Continued)

(58) Field of Classification Search
CPC ...... H02J 9/06; H02J 7/00; H02J 9/065; H02J 7/00306; H02J 7/0047; H02J 7/35;
(Continued)

(56) References Cited

U.S. PATENT DOCUMENTS 10,526,757 B2   1/2020   Lee et al.
10,832,598 B2   11/2020  Lee et al.

FOREIGN PATENT DOCUMENTS

KR   10-2009-0081955 A   7/2009
KR   10-0934624 B1       1/2010
(Continued)

OTHER PUBLICATIONS

International Search Report of corresponding PCT/KR2019/004788, dated Jul. 25, 2019, with English transaltion, 5 pages.

*Primary Examiner* — Robert L Deberadinis
(74) *Attorney, Agent, or Firm* — Lewis Roca Rothgerber Christie LLP

(57) ABSTRACT

A light-emitting sign device according to the present invention comprises: a solar cell; a battery module comprising at least one battery in which power generated by the solar cell is stored; a light-emitting module for emitting light by the power supplied from the battery; a front panel optically coupled to the light-emitting module; and a controller for applying, to the light-emitting module, a target mode determined, from among driving modes, on the basis of an average value of solar cell voltages measured for a certain period with respect to the solar cell and a voltage value of a battery voltage measured at a certain time with respect to the battery module.

15 Claims, 13 Drawing Sheets

(51) Int. Cl.
*G01R 19/25* (2006.01)
*G09F 13/00* (2006.01)
*H02S 40/38* (2014.01)
*G01R 31/3835* (2019.01)
*G09F 13/22* (2006.01)
*G09F 13/42* (2006.01)
*H02J 7/35* (2006.01)

(52) U.S. Cl.
CPC ............ *G09F 13/005* (2013.01); *G09F 13/22* (2013.01); *G09F 13/42* (2013.01); *H02J 7/0047* (2013.01); *H02J 7/00306* (2020.01); *H02J 7/35* (2013.01); *H02S 40/38* (2014.12); *G09F 2013/222* (2013.01)

(58) Field of Classification Search
CPC .. H02S 40/38; G09F 31/3835; G09F 19/2503; G09F 19/25; G09F 13/005; G09F 13/22; G09F 13/42; G09F 2013/222; G09F 13/00
See application file for complete search history.

(56) References Cited

FOREIGN PATENT DOCUMENTS

| | | |
|---|---|---|
| KR | 10-2012-0114828 A | 10/2012 |
| KR | 10-1492578 B1 | 2/2015 |
| KR | 10-1621668 B1 | 6/2016 |
| KR | 10-1783709 B1 | 10/2017 |
| KR | 10-1801621 B1 | 12/2017 |
| KR | 10-1835819 B1 | 3/2018 |
| KR | 10-2018-0065199 A | 6/2018 |

FIG. 8

| DRIVING MODE | POWER SUPPLY RATIO | 17:00~18:00 | 18:00~21:00 | 21:00~24:00 | 24:00~04:00 | 04:00~06:00 | 06:00~07:00 |
| --- | --- | --- | --- | --- | --- | --- | --- |
| | | SUNSET | EVENING | NIGHT | MIDDLE OF THE NIGHT | DAWN | SUNRISE |
| A | 15 | 150% | 100%(REFERENCE BRIGHTNESS) | 100% | 100% | 100% | 150% |
| B | 13 | 150% | 100% | 100% | 50% | 100% | 150% |
| C | 9.5 | 100% | 100% | 50% | 50% | 50% | 100% |
| D | 7 | 50% | 50% | 50% | 50% | 50% | 50% |
| E | 6 | 0% | 50% | 50% | 50% | 50% | 0% |
| F1,F2 | 3 | 0% | 25% | 25% | 25% | 25% | 0% |

FIG. 13

| SKT | | | | ⏶ ᵃ₌77% 🔋9:09 PM |
|---|---|---|---|---|
| DETAILS OF EVENT | | | | × |
| No. | TIME | SOLAR | BATTERY | POWER CONSUMPTION |
| 1. | 02-01 16:58 | 15.5 | 14.0 | 0 |
| 2. | 02-01 15:58 | 17.4 | 14.0 | 0 |
| 3. | 02-01 14:58 | 19.4 | 14.0 | 0 |
| 4. | 02-01 13:57 | 16.3 | 14.0 | 0 |
| 5. | 02-01 12:57 | 16.1 | 14.0 | 0 |
| 6. | 02-01 11:57 | 16.0 | 14.0 | 0 |
| 7. | 02-01 10:57 | 15.3 | 14.0 | 0 |
| 8. | 02-01 09:57 | 14.9 | 13.0 | 0 |
| 9. | 02-01 08:57 | 14.6 | 13.0 | 0 |
| 10. | 02-01 07:56 | 9.4 | 12.0 | 0 |
| 11. | 02-01 06:55 | 0.1 | 12.0 | 89 |

LIGHT-EMITTING SIGN DEVICE AND LOW-POWER PREDICTIVE DIAGNOSIS BIDIRECTIONAL ADAPTIVE CONTROL SYSTEM COMPRISING SAME

CROSS-REFERENCE TO RELATED APPLICATION(S)

This application is a U.S. National Phase Patent Application of International Application Number PCT/KR2019/004788, filed on Apr. 19, 2019, which claims priority to and the benefit of Korean Patent Application Number 10-2018-0072971, filed on Jun. 25, 2018, the entire contents of all of which are incorporated herein by reference.

TECHNICAL FIELD

The present invention relates to a light-emitting sign device.

BACKGROUND ART

In general, sign devices are installed on roads such as city roads, national highways, and expressways so that drivers may identify information such as a speed limit and a moving direction to conveniently drive to a destination while visually checking the sign devices.

Recently, in order to improve visibility of sign devices at night, light-emitting sign devices using light-emitting diodes (LEDs) and the like are being developed.

Such a light-emitting sign device is capable of generating necessary power using a solar cell during the day, storing the power in a battery, and causing LEDs to emit light using the power stored in the battery at night. Patent Document 1 below discloses an example of such a light-emitting sign device.

However, the solar cell is not capable of always generating a certain amount of power due to a change in the weather, and when the amount of power with which a battery is charged during the day is insufficient, overdischarge may occur at night, thus reducing the battery's lifetime. Patent Document 1 does not propose a countermeasure against this problem.

Patent Document 1 discloses that a light-emitting sign device can be managed using a mobile device but only briefly discloses a method of identifying a normal or fault state of an LED. That is, Patent Document 1 discloses a method of identifying failures, which already have occurred, through a mobile device or the like. Patent Document 1 also discloses that a light-emitting sign device communicates with a mobile device through a 3G or 4G communication module but this technique is difficult to apply to actual products due to excessive increase in power consumption and costs. (Patent Document 1) Korean Registered Patent Publication No. 10-1801621 (Nov. 21, 2017)

DISCLOSURE

Technical Problem

Provided is a light-emitting sign device which is capable of sensing a voltage of a battery and the like at low costs, predictively diagnosing the possibility of a failure of the battery and the like on the basis of sensed voltage, and accurately transmitting a result of the predictively diagnosing to a remote device at low costs and which is easily manageable through the remote device.

Technical Solution

According to one aspect of the present invention, a light-emitting sign device includes a solar cell, a battery module including at least one battery for storing power generated from the solar cell, a light-emitting module configured to emit light from power supplied from the battery, a front panel optically coupled to the light-emitting module, and a controller configured to apply, to the light-emitting module, a target mode determined on the basis of an average value of solar cell voltages of the solar cell measured for a certain period and a voltage value of a battery voltage of the battery module measured at a certain point of time among driving modes.

Amounts of power supplied to the light-emitting module may be different from each other according to the driving modes.

The light-emitting sign device may further include a transceiver configured to transmit a predictive diagnosis signal corresponding to the target mode to a remote device.

The driving modes may include first driving modes and second driving modes. The first driving modes may be driving modes determined as the target mode when the certain period is less than a reference period and the average value is less than a solar cell reference voltage value, and the second driving modes may be driving modes determined as the target mode when the certain period is equal to or greater than the reference period and the average value is less than the solar cell reference voltage value.

The first driving modes may include a battery overdischarge mode determined as the target mode when a voltage value of the battery voltage is less than or equal to a first battery reference voltage value, and remaining driving modes among the first driving modes, except, the battery overdischarge mode, may be set to supply less power to the light-emitting module as the certain period corresponding thereto increases and supply more power to the light-emitting module than the battery overdischarge mode.

The second driving modes may include an insufficient sunshine mode determined as the target mode when a voltage value of the battery voltage is less than or equal to a second battery reference voltage value, the second battery reference voltage value may be lower than the first battery reference voltage value, and remaining driving modes among the second driving modes, except the insufficient sunshine mode, may be set to supply more power to the light-emitting module than the insufficient sunshine mode.

When the average value of the solar cell voltages is zero, the controller may apply a third driving mode, which is different from the driving modes, as the target mode to the light-emitting module regardless of a voltage value of the battery voltage.

The predictive diagnosis signal may include at least one of a battery overdischarge notification, an insufficient sunshine amount notification, and a solar cell failure notification. The battery overdischarge notification may be transmitted to the remote device when the battery overdischarge mode is determined as the target mode, the insufficient sunshine amount notification may be transmitted to the remote device when the insufficient sunshine mode is determined as the target mode, and the solar cell failure notification may be transmitted to the remote device when the third driving mode is determined as the target mode.

The light-emitting sign device may further include a first resistor connected in parallel to the solar cell, and a second resistor connected in parallel to the battery. The controller may include an analog-to-digital converter therein. The analog-to-digital converter may be connected to one end of the first resistor connected to a positive electrode of the solar cell through a first sensing line and connected to one end of the second resistor connected to a positive electrode of the battery through a second sensing line.

The controller may calculate the solar cell voltages using a digital conversion value of an analog voltage sensed by the first sensing line and calculate the battery voltage using a digital conversion value of an analog voltage sensed by the second sensing line.

The light-emitting module may include a light-emitting element, an emission control transistor, and a third resistor which are connected in series, and the analog-to-digital converter may be connected to a non-ground electrode of the third resistor through a third sensing line.

The controller may calculate a driving current of the light-emitting device using a digital conversion value of an analog voltage sensed by the third sensing line.

The light-emitting sign device may further include a transceiver configured to transmit values of the solar cell voltages, the battery voltage, and the driving current to the remote device.

According to another aspect of the present invention, a light-emitting sign device includes a solar cell; a battery module including at least one battery for storing power generated from the solar cell; a light-emitting module configured to emit light from power output from the battery; a front panel optically coupled to the light-emitting module; and a controller including an analog-to-digital converter therein. The light-emitting module includes a light-emitting element, an emission control transistor, and a resistor which are connected in series, and the analog-to-digital converter is connected to a non-ground electrode of the resistor through a sensing line.

The controller may calculate a driving current of the light-emitting element using a digital output value of an analog voltage sensed by the sensing line.

Advantageous Effects

A light-emitting sign device according to the present invention is capable of sensing a voltage of a battery and the like at low costs, predictively diagnosing the possibility of a failure of the battery and the like on the basis of sensed voltage, and accurately transmitting a result of the predictively diagnosing to a remote device at low costs, and is easily manageable through the remote device.

DESCRIPTION OF DRAWINGS

FIG. 8 is a diagram for describing driving modes according to an embodiment of the present invention.

FIGS. 11 to 13 are views for describing a remote device according to another embodiment of the present invention.

MODES OF THE INVENTION

Figure 1:
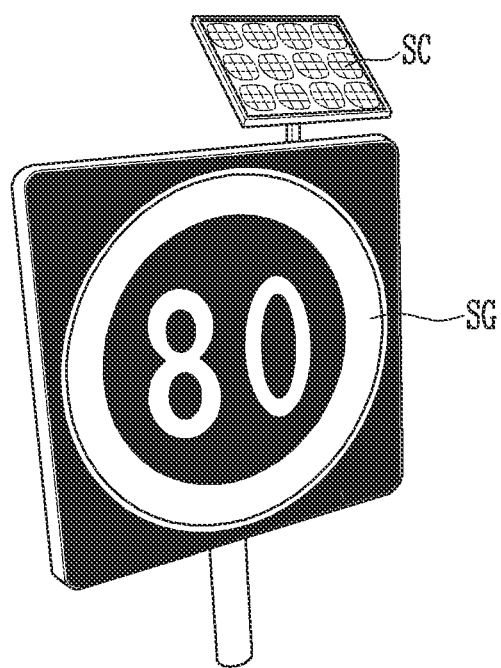
FIGS. 1 and 2 are diagrams for describing the appearance of a light-emitting sign device according to an embodiment of the present invention.

Hereinafter, various embodiments of the present invention will be described in detail with reference to the accompanying drawings below so that they may be easily implemented by those of ordinary skill in the art. However, the present invention may be embodied in many different forms and is not limited to the embodiments set forth herein.

For clarity, parts that are not related to explaining the present invention are omitted in the drawings and the same reference numerals are allocated to the same or like components throughout the specification. Therefore, reference numerals described above may also be used in other drawings.

A size and thickness of each component shown in the drawings are arbitrarily shown for convenience of description and thus the present invention is not necessarily limited thereby. In the drawings, thicknesses of each layer and each region may be exaggerated for clarity.

Figure 2:
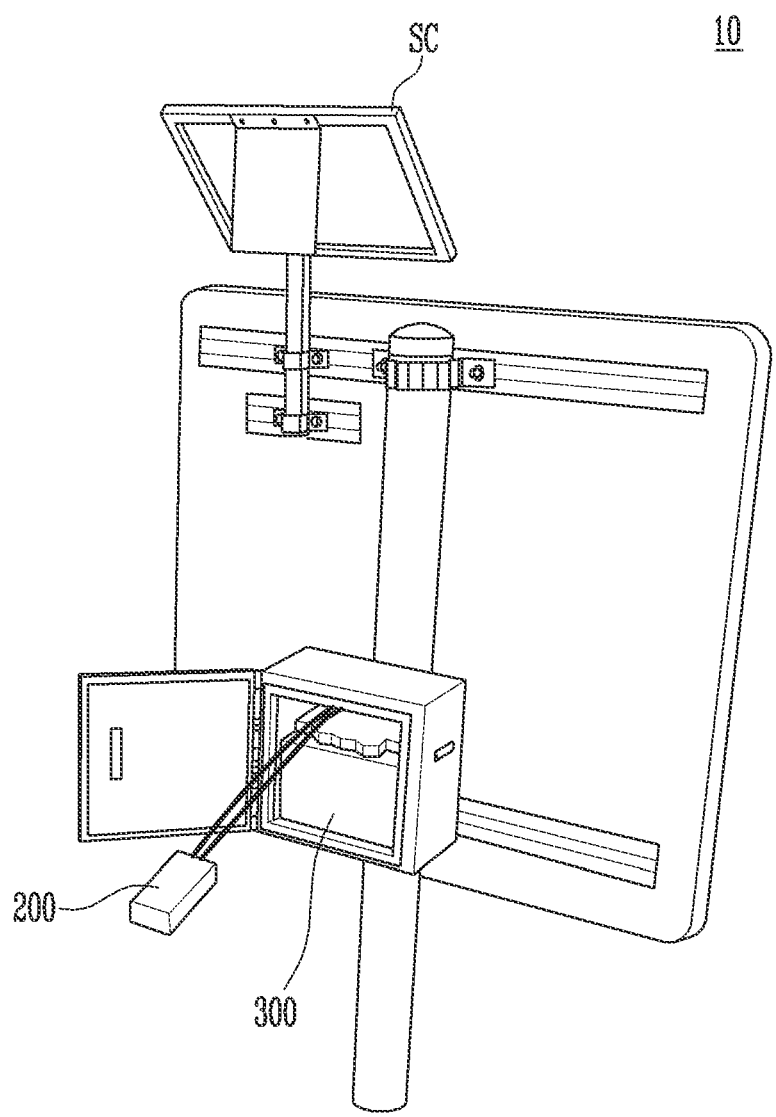

FIGS. 1 and 2 are diagrams for describing the appearance of a light-emitting sign device according to an embodiment of the present invention.

Referring to FIGS. 1 and 2, a light-emitting sign device 10 according to an embodiment of the present invention includes a solar cell SC, a front panel SG, a controller 200, and a battery module 300.

The front panel SG may provide road information represented by at least one of a picture, letters, numbers, and symbols.

For example, the front panel SG may have a form in which a substrate, a retro-reflective sheet, and a color sheet are sequentially stacked. The retro-reflective sheet may be located on a front surface of the substrate, and the color sheet may be partially located on the retro-reflective sheet corresponding to road information. The front panel SG may include through-holes passing through the substrate, the retro-reflective sheet, and the color sheet. For example, the front panel SG may be optically coupled to a light-emitting module by fitting optical fibers extending from the light-emitting module into the through-holes.

As another example, the front panel SG may not include through-holes. In this case, the retro-reflective sheet may be replaced with a transmissive retro-reflective sheet. An existing retro-reflective sheet is used only to reflect external light, whereas a transmissive retro-reflective sheet may perform a function of transmitting internal light and reflecting external light. For example, the existing retro-reflective sheet may be a prism sheet in which threads are arranged in a plane direction, and the threads reflect external light. The transmissive retro-reflective sheet includes a threaded area and a non-threaded flat area and thus may transmit internal light through the flat area. The substrate may be formed of a transparent material. In this case, the light-emitting module may be located on a rear or lateral side of the front panel SG.

The front panel SG includes necessary optical path members such as a reflective member and a light guide plate and thus may be optically coupled to the light-emitting module.

The front panel SG may be optically coupled to the light-emitting module in various ways in addition to the above-described embodiment.

The solar cell SC may generate electric power required for driving the light-emitting sign device 10. Power generated by the solar cell SC may be supplied to the battery module 300 to charge a battery. In one embodiment, the power generated by the solar cell SC may be directly supplied as power to be consumed by the light-emitting module (see FIGS. 5 and 6).

The battery module 300 may include at least one battery in which power generated by the solar cell SC is stored. The battery may supply power to cause the light-emitting module to emit light.

The controller 200 may apply, to the light-emitting module, a target mode determined on the basis of an average value of voltages of the solar cell SC measured for a certain period and a voltage of the battery measured at a certain point of time among driving modes. This will be described in detail with reference to FIG. 7 and the other drawings below.

Figure 3:
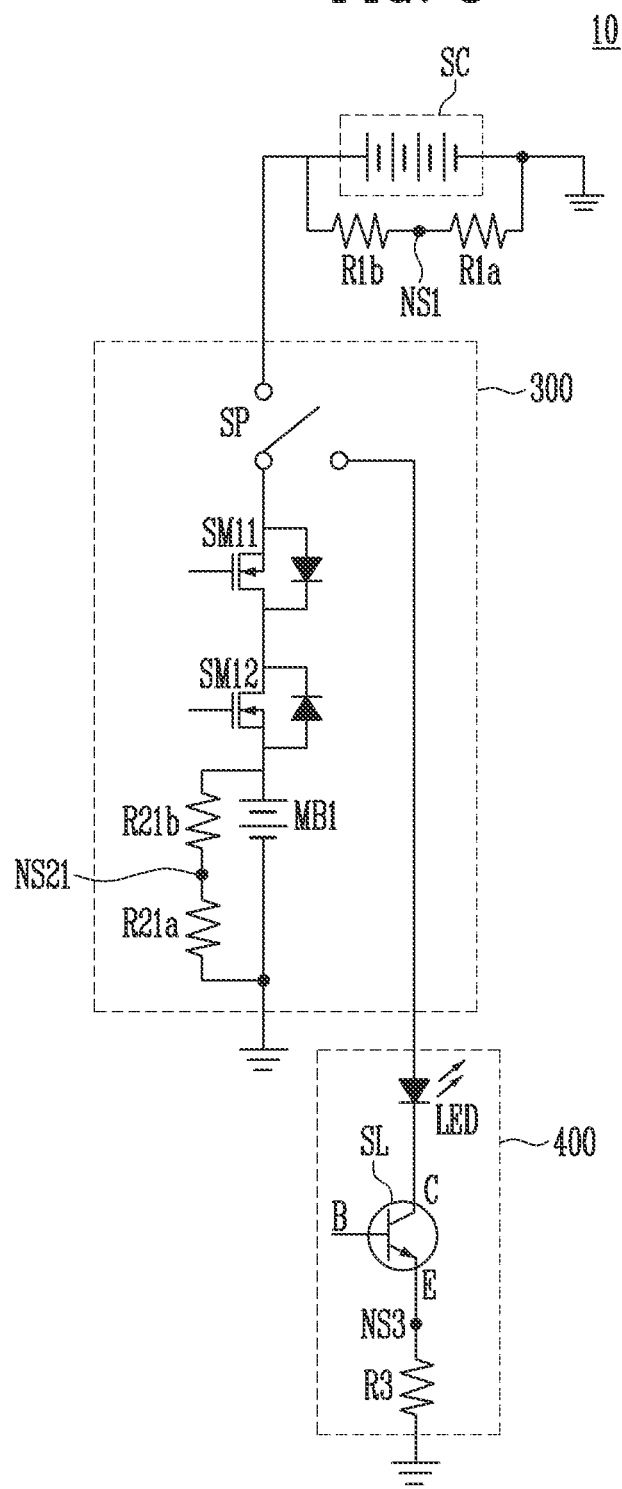
FIG. 3 is a diagram for describing a circuit structure of a light-emitting sign device according to an embodiment of the present invention.

FIG. 3 is a diagram for describing a circuit structure of a light-emitting sign device according to an embodiment of the present invention.

Referring to FIG. 3, it can be seen that an exemplary circuit structure includes a solar cell SC, a battery module 300, and a light-emitting module 400 which are included in a light-emitting sign device 10 according to an embodiment of the present invention.

The light-emitting module 400 may include a light-emitting element LED, an emission control transistor SL, and a third resistor R3 which are connected in series. The light-emitting element LED may be, for example, a light-emitting diode. Here, the emission control transistor SL is an NPN bipolar junction transistor (BJT) but other transistors such as a PNP BJT and a field-effect transistor (FET) may be used as the emission control transistor SL. One end of the third resistor R3 may be connected to the emission control transistor SL and another end thereof may be connected to a ground voltage source.

The solar cell SC may be connected between the battery module 300 and the ground voltage source. First resistors R1a and R1b may be connected in parallel to the solar cell SC. A first sensing node NS1 may be positioned between the first resistors R1a and R1b. A resistance ratio between the first resistors R1a and R1b may be appropriately determined according to a required sensor voltage. In one embodiment, the first resistors R1a and R1b may be variable resistors.

The battery module 300 may include a battery MB1, a discharge switch SM11, a charge switch SM12, and a path determination switch SP. The path determination switch SP is controlled to connect the battery module 300 and the solar cell SC in a charging mode and to connect the battery module 300 and the light-emitting module 400 in a driving mode. The battery module 300 may include second resistors R21a and R21b connected in parallel to the battery MB1. A second sensing node NS2I may be positioned between the second resistors R21a and R21b. A resistance ratio between the second resistors R21a and R21b may be appropriately determined according to a required sensor voltage. In one embodiment, the second resistors R21a and R21b may be variable resistors.

The battery MB1 may receive charge power from a positive electrode of the solar cell SC through the charge/discharge switch SM11 or SM12 or supply discharge power to the light-emitting module 400. For example, when the charge switch SM12 is turned on and the discharge switch SM11 is turned off by the controller 200, the battery MB1 may receive charge power. When the discharge switch SM11 is turned on and the charge switch SM12 is turned off by the controller 200, the battery MB1 may supply discharge power. When both the charge switch SM11 and the discharge switch SM12 are turned off by the controller 200, the battery MB1 may enter a standby mode.

The light-emitting element LED may emit light according to a driving current flowing through a driving current path when an anode electrode of the light-emitting element LED is connected to the positive electrode of the battery MN1 through the path determination switch SP, the discharge switch SM11, and the charge switch SM12 and a cathode electrode thereof is connected to the ground voltage source through the emission control transistor SL and the third resistor R3. In this case, a dimming level, i.e., a brightness level, of the light-emitting element LED may be adjusted by adjusting an ON/OFF duty ratio of the emission control transistor SL.

Figure 4:
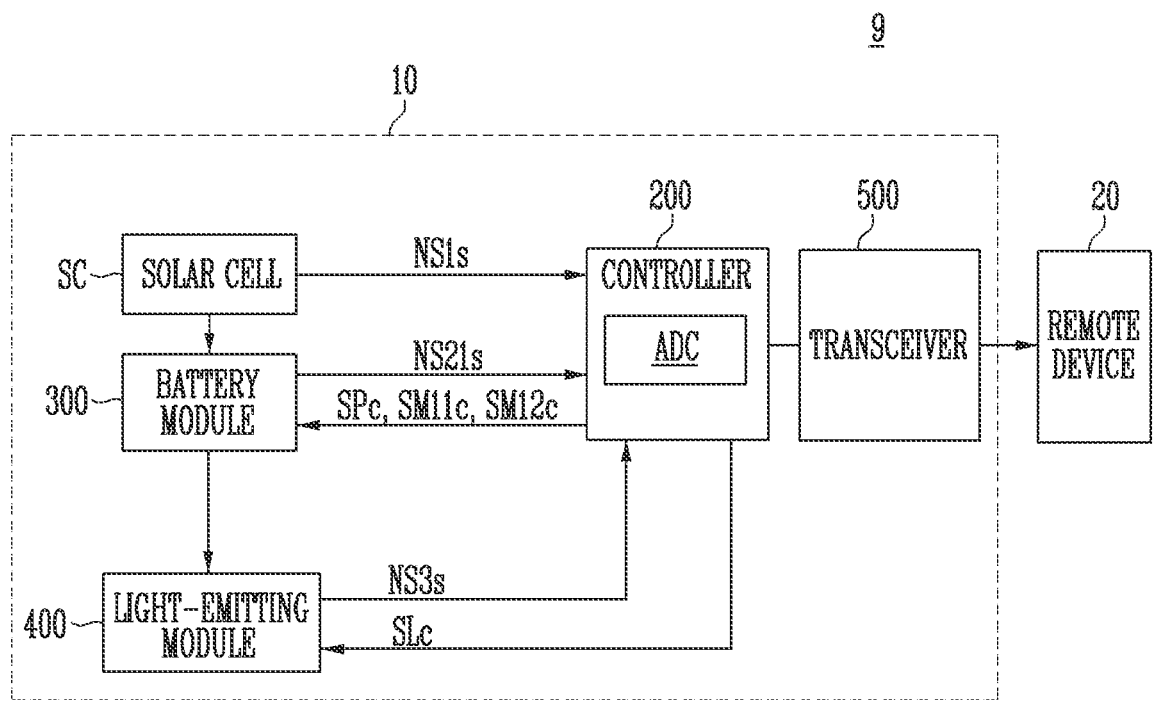
FIG. 4 is a diagram for describing a predictive diagnosis system including a light-emitting sign device according to an embodiment of the present invention.

FIG. 4 is a diagram for describing a predictive diagnosis system including a light-emitting sign device according to an embodiment of the present invention.

Referring to FIG. 4, a predictive diagnosis system 9 includes a light-emitting sign device 10 and a remote device 20.

The light-emitting sign device 10 may further include a transceiver 500 in addition to the solar cell SC, the battery module 300, the light-emitting module 400, and the controller 200 described above.

The controller 200 may be, for example, a micro-controller unit (MCU) and may include an analog-digital converter ADC therein.

The analog-to-digital converter ADC may be connected to a first sensing node NS1 through a first sensing line and connected to a second sensing node NS21 through a second sensing line. In addition, the analog-to-digital converter ADC may be connected to a third sensing node NS3 corresponding to a non-ground electrode of a third resistor R3 through a third sensing line (see FIG. 3).

The analog-to-digital converter ADC may receive a first sensing signal NS1s corresponding to a solar cell voltage through the first sensing line and receive a second sensing signal NS21s corresponding to a battery voltage through the second sensing line. In addition, the analog-to-digital converter ADC may receive a third sensing signal NS3s corresponding to a voltage of the third sensing node NS3 through the third sensing line.

The controller 200 may calculate solar cell voltages using a digital conversion value of the first sensing signal NS1s and calculate a battery voltage using a digital conversion value of the second sensing signal NS21s. In addition, the controller 200 may calculate a driving current of the light-emitting element LED by using the digital conversion value of the third sensing signal NS3s.

Due to the above configuration, the amount of driving current of the light-emitting element LED and the like may be detected without an integrated circuit (IC) type current sensor or a Hall effect sensor. According to the configuration of the present embodiment, a sensed voltage may be calculated back to a current using Ohm's law (V=IR) by the analog-to-digital converter ADC included in the MCU. Existing IC type current sensors or Hall effect sensors consume power by themselves and have a problem in that a failure may occur due to high temperatures and interference of other electromagnetic waves. According to the configuration of the present invention, a current may be measured at minimum costs without trouble by using a resistor that is strong against heat and noise as a sensing element.

The controller 200 may transmit, to the battery module 300, control signals SPc, SM11c, and SM12c for controlling the path determination switch SP and the charge/discharge switches SM11 and SM12 to be turned on or off. In addition, the controller 200 may transmit a control signal SLc for controlling the emission control transistor SL to the light-emitting module 400.

The controller 200 may apply, to the light-emitting module 400, a target mode determined on the basis of an average value of voltages of the solar cell SC measured for a certain period among driving modes and a battery voltage measured with respect to the battery module 300 at a certain point of time. That is, the controller 200 may determine the target mode by calculating the average value of the voltages of the solar cell SC on the basis of the received first sensing signal NS1s and calculating the battery voltage on the basis of the received second sensing signal NS21s and apply the determined target mode to the light-emitting module 400 by controlling the emission control transistor SL to be turned on or off through the control signal SLc.

The amounts of power to be supplied to the light-emitting module 400 in the driving modes may be differently set, as will be described with reference to FIGS. 7 and 8 below.

The transceiver 500 may transmit a predictive diagnosis signal corresponding to the target mode to the remote device. The predictive diagnosis signal may include at least one of a battery overdischarge notification, an insufficient sunshine amount notification, and a solar cell failure notification. Situations in which the predictive diagnosis signal is generated will be described with reference to FIGS. 7 and 8 below.

The remote device 20 may be a general purpose computer or a dedicated computer including at least one processor and at least one memory for processing information. For example, the remote device 20 may correspond to a server, a desktop computer, a notebook computer, a mobile device or the like. A user may check a state of the light-emitting sign device 10 or whether maintenance is required by referring to the predictive diagnosis signal received through the remote device 20.

The transceiver 500 may transmit the predictive diagnosis signal or the like to the remote device 20 through a low-power wide-area network (LPWAN). Although a speed of data transmission through the LPWAN is slower than those of data transmission according to other communication methods, the speed of data transmission may be sufficient to identify a state of the light-emitting sign device 10 or whether maintenance is required. In addition, this communication method is advantageous in that this method is relatively inexpensive to implement and power consumption thereof is very low.

In one embodiment, the controller 200 may detect and analyze a daily power generation trend in areas in which it is difficult to install devices and the amount of sunshine is insufficient, such as in the shade of a tree or between buildings in an urban area, and determine and diversify a driving mode matching a power generation amount at a corresponding location. For example, as a result of analyzing the daily power generation trend, basic lighting brightness may be lowered to 70% when insufficient charging occurs continuously, adjusted back to 100% when the power generation amount is restored, and increased to 130% if necessary when overcharging occurs, thereby providing optimal information to a driver.

A current consumption rate of each LED light source module and a driving time may be accumulatively counted and recorded in an internal memory of the controller, and programming may be performed to manage lifetime expectancy of an LED light source. For example, when a current consumption rate of the LED light source is highly likely to be high according to a weather condition and installation conditions in each region, the remaining lifetime of the LED light source may be insufficient due to heat proportional to the current consumption rate as compared to a desired lifetime of a product. In this case, the controller 200 may be switched to a lower power mode to reduce power consumption, thereby reducing the number of lightings over the desired lifetime of the LED light source. Therefore, desired lifetimes of all LED light sources may be maintained for the remaining lifetime of the product, and a lighting ode may be determined according to a given environment.

In one embodiment, the controller 200 may periodically transmit sensing information of the first to third sensing signals NS1s, NS21s, and NS3s to the remote device 20 through the transceiver TC. In this case, the remote device 20 may be a control server. The controller 200 and the transceiver 500 may be integrally configured according to a product. In this case, the transceiver 500 and the remote device 20 may communicate with each other through a predetermined protocol and a long range (LoRa) communication network which is a low-cost small data communication network.

The remote device 20 may actively conduct inspection according to received information. For example, the remote device 20 may include a data server and perform a failure diagnosis by analyzing a pattern on the basis of information of the optical fiber light-emitting sign device 10 received by the data server. The remote device 20 may transmit diagnosis result information or information regarding measures according to a result of performing the failure diagnosis to the transceiver 500. The controller 200 may actively take measures for a fault according to the diagnosis result information or passively take measures for the fault according to the information regarding the measures.

In one embodiment, the controller 200 may receive real-time weather information corresponding to location information of the light-emitting sign device 10 from the remote device 20 through the transceiver 500 according to the predetermined protocol.

Received weather information of each region may be a criterion for the controller 200 to determine the lighting mode, and a driver's visibility may be maximized by adjusting the brightness and lighting period of each light through an operation unit included in the controller 200. For example, this may apply in case of ice on the road, e.g., black ice in winter, and the speed of a vehicle that exceeds a safe speed may be sensed and a warning message may be delivered to the driver of the vehicle by blinking a deceleration induction message with a brightness ten times stronger than the brightness of a general light at a ratio of 3:7 blinks per second. The controller 200 may transmit sensing information to the remote device 20 through the transceiver 500, and the remote device 20 may analyze the sensing information and provide the controller 200 with information as to whether fog has occurred. In this case, the remote device 20 may more accurately identify whether fog has developed by combining weather information provided from another server in addition to the sensing information.

In one embodiment, the controller 200 may control a plurality of light-emitting diodes according to a light-emitting mode, include N emission control functions corresponding to N light-emitting modes in a software manner, and generate M light-emitting modes, which do not belong to the N light-emitting modes, by combining the N emission control functions, wherein N and M represent natural numbers.

For example, the controller 200 may be an MCU including a block-type function therein. All lighting modes flight-emitting modes) drivable by signs are stored in the form of block-type functions in a program area of the memory built in the MCU at the time of shipment of the product, and a firmware program may be designed to allow self-diversification of each light-emitting mode through a combination of functions and calling a function. Existing products are disadvantages in that different firmware is stored for each lighting mode and thus a program should be downloaded to an MCU to change a lighting mode. According to an embodiment of the present invention, all possible lighting modes are blocked in the form of function in an internal memory of an MCU during the shipment of a product, and thus, an operation mode transmitted according to an external environment and a communication signal may be determined through a combination and substitution of stored functions, and only an integrated program may be installed regardless of firmware during shipment of each product, thereby increasing efficiency of product management.

In one embodiment, the controller 200 may communicate with the remote device 20 and generate one of the M light-emitting modes in response to an instruction from the remote device 20. In one embodiment, the remote device 20 may instruct to generate the same certain light-emitting mode with respect to a plurality of light-emitting sign devices in an adjacent area among M light-emitting modes.

For example, an integrated control system may be configured by sharing and integrating environmental change patterns in a target area through a communication network to collectively control lighting modes of all signs installed in a nearby area in which similar patterns are detected. The above-described control system may be implemented using the LPWAN. An operation function for each lighting mode is built in advance in the memory of the MCU and thus automatic switching may be performed in response to an external environment. The MCU may perform switching between lighting modes even through a small amount of data signal received through the LPWAN. By installing an algorithm in advance in each product for comparing and analyzing information detected by each sensor and integrated information received through the LPWAN, malfunctions that may occur due to errors or defects in each sensor may be minimized to provide users with optimal services and long-lasting and high-durability products.

In one embodiment, the remote device 20 may update a light-emitting mode of the controller 200 to generate a new emission control function by changing parameters of an emission control function.

For example, even when an integrated function block is included in the MCU, the function block may be designed to be upgraded remotely through the LPWAN when other functions need to be additionally implemented over time. This enables a remote firmware update function, which was implementable only in high-performance MCUs equipped with an operating system such as Linux, to be implemented in low-specification MCUs such as of an Internet-of-Things. Input parameters of a function logic may be modified through an algorithm for dividing and receiving a small amount of data periodically transmitted through the LPWAN and re-synthesizing the received data, thereby modifying and supplementing a function of a function block.

Figure 5:
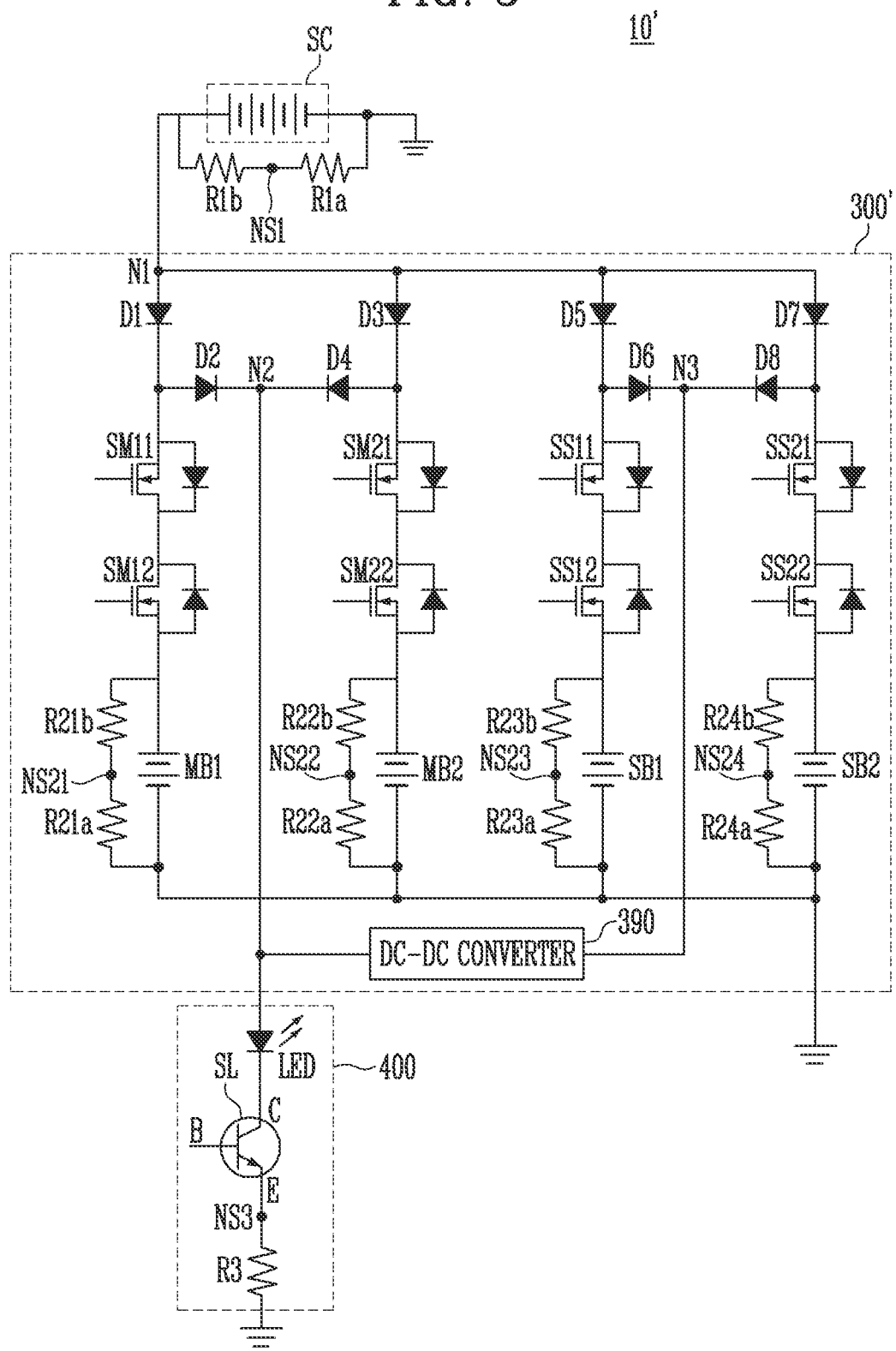
FIG. 5 is a diagram for describing a circuit structure of a light-emitting sign device according to another embodiment of the present invention.

FIG. 5 is a diagram for describing a circuit structure of a light-emitting sign device according to another embodiment of the present invention.

Referring to FIG. 5, it can be seen that an exemplary circuit structure includes a solar cell SC, a battery module 300', and a light-emitting module 400 which are included in a light-emitting sign device 10' according to another embodiment of the present invention.

The light emitting module 400 may be connected to a second node N2. The light-emitting module 400 may include a light-emitting element LED, an emission control transistor SL, and a third resistor R3 which are connected in series. The light-emitting element LED may be, for example, a light-emitting diode. Here, the emission control transistor SL is an NPN BJT but another transistor such as a PNP BJT or an FET may be used. One end of the third resistor R3 may be connected to the emission control transistor SL and the other end thereof may be connected to a ground voltage source.

A positive electrode of the solar cell SC may be connected to a first node N1. In general, the solar cell SC may generate power during the day and supply the power to the first node N1. First resistors R1$a$ and R1$b$ may be connected to be parallel to the solar cell SC. A resistance ratio between the first resistors R1$a$ and R1$b$ may be appropriately determined according to a required sensor voltage. In one embodiment, the first resistors R1$a$ and R1$b$ may be variable resistors.

The battery module 300' may include a first main battery MB1, a second main battery MB2, a first sub-battery SB1, a second sub-battery SB2, charge/discharge switches SM11, SM12, SM21, SM22, SS11, SS12, SS21, and SS22, diodes D1, D2, D3, D4, D5, D6, D7, and D8, and a direct current (DC)-DC converter 390. In addition, the battery module 300' may include second resistors R21$a$ and R21$b$ connected in parallel to the first main battery MB1, second resistors R22$a$ and R22$b$ connected in parallel to the second main battery MB2, second resistors R23$a$ and R23$b$ connected in parallel to the first sub-battery SB1, and second resistors R24$a$ and R24$b$ connected in parallel to the second sub-battery SB2. Resistance ratios between the second resistors R21$a$, R21$b$, R22$a$, R22$b$, R23$a$, R23$b$, R24$a$, and R24$b$ may be appropriately determined according to a required sensor voltage. In one embodiment the second resistors R21$a$, R21$b$, R22$a$, R22$b$, R23$a$, R23$b$, R24$a$, and R24$b$ may be variable resistors.

An anode of the first diode D1 may be connected to the first node N1 and a cathode thereof may be connected to the charge/discharge switches SM11 and SM12 of the first main battery MB1. An anode of the second diode D2 may be connected to the charge/discharge switches SM11 and SM12 of the first main battery MB1 and a cathode thereof may be connected to a second node N2. An anode of the third diode D3 may be connected to the first node N1 and a cathode thereof may be connected to the charge/discharge switches SM21 and SM22 of the second main battery MB2. An anode of the fourth diode D4 may be connected to the charge/discharge switches SM21 and SM22 of the second main battery MB2 and a cathode thereof may be connected to the second node N2.

An anode of the fifth diode D5 may be connected to the first node N1 and a cathode thereof may be connected to the charge/discharge switches SS11 and SS12 of the first sub-battery MB1. An anode of the sixth diode D6 may be connected to the charge/discharge switches SS11 and SS12 of the first sub-battery SB1 and a cathode thereof may be connected to a third node N3. An anode of the seventh diode D7 may be connected to the first node N1 and a cathode thereof may be connected to the charge/discharge switches SS21 and SS22 of the second sub-battery SB2. An anode of the eighth diode D8 may be connected to the charge/discharge switches SS21 and SS22 of the second sub-battery SB2 and a cathode thereof may be connected to the third node N3.

The first main battery MB1 may receive charge power from the first node N1 or supply discharge power to the second node N2 through the charge/discharge switches SM11 and SM12. For example, when the charge switch SM12 is turned on by the controller 200 and the discharge switch SM11 is turned off by the controller 200, the first main battery MB1 may receive charge power from the first node N1. When the discharge switch SM11 is turned on and the charge switch SM12 is turned off by the controller 200, the first main battery MB1 may supply discharge power to the second node N2. When both the charge switch SM11 and the discharge switch SM12 are turned off by the controller 200, the first main battery MB1 may enter the standby mode.

The second main battery MB2 may receive charge power from the first node N1 or supply discharge power to the second node N2 through the charge/discharge switches SM21 and SM22. For example, when the charge switch SM22 is turned on and the discharge switch SM21 is turned off by the controller 200, the second main battery MB2 may receive charge power from the first node N1. When the discharge switch SM21 is turned on and the charge switch SM22 is turned off by the controller 200, the second main battery MB2 may supply discharge power to the second node N2. When both the charge switch SM21 and the discharge switch SM22 are turned off by the controller 200, the second main battery MB2 may enter the standby mode.

The first sub-battery SB1 may receive charge power from the first node N1 or supply discharge power to the third node N3 through the charge/discharge switches SS11 and SS12. For example, when the charge switch SS12 is turned on and the discharge switch SS11 is turned off by the controller 200, the first sub-battery SB1 may receive charge power from the first node N1. When the discharge switch SS11 is turned on and the charge switch SS12 is turned off by the controller 200, the first sub-battery SB1 may supply discharge power to the third node N3. When both the charge switch SS11 and the discharge switch SS12 are turned off by the controller 200, the first sub-battery SB1 may enter the standby mode.

The second sub-battery SB2 may receive charge power from the first node N1 or supply discharge power to the third node N3 through the charge/discharge switches SS21 and SS22. For example, when the charge switch SS22 is turned on and the discharge switch SS21 is turned off by the controller 200, the second sub-battery SB2 may receive charge power from the first node N1. When the discharge switch SS21 is turned on and the charge switch SS22 is turned off by the controller 200, the second sub-battery SB2 may supply discharge power to the third node N3. When both the charge switch SS21 and the discharge switch SS22 are turned off by the controller 200, the second sub-battery SB2 may enter the standby mode.

The DC-DC converter 390 may be located between the second node N2 and the third node N3. The main batteries MB1 and MB2 and the sub-batteries SB1 and SB2 may be batteries according to different standards or have different capacities. The DC-DC converter 390 may be located between the second node N2 and the third node N3 to remove or increase a voltage difference between the second node N2 and the third node N3, which is generated accordingly. For example, when necessary power is supplied to the light-emitting module 400, a voltage of the third node N3 may be lower than that of the second node N2.

The light-emitting sign device 10' of the present embodiment is designed in that the charge switches SM12, SM22, SS12 and SS22 and the discharge switches SM11, SM21, SS11 and SS21 are separately provided at power input/output terminals of the batteries MB1, MB2, SB1, and SB2 and are switched through switching control so that a certain amount of power may be supplied to a light source to turn on lights even during the day, and at the same time, surplus power may be stored in the battery module 300'.

The first and second main batteries MB1 and MB2 may be batteries according to the same standard, and a dual power path circuit in which charging and discharging are separated may be formed in each of the first and second main batteries MB1 and MB2 so that the first main battery MB1 that is in a charging cycle may only be charged and the second main battery MB2 that is in a discharging cycle may only be discharged, thereby performing charging/discharging at the same time while protecting a battery usable cycle.

In addition, when the first main battery MB1 that is being charged is fully charged, charging is stopped to change to the standby mode, and surplus electric power that is being generated may be controlled to be directly supplied to a load that is being discharged so that the surplus electric power may be used as power to be consumed by the light source module 400 together with the second main battery MB2 that is being discharged.

This system is capable of protecting a battery usage cycle and turning on lights during the day, and thus, the visibility of signs that change according to a change in the altitude of the sun may be improved and use of power generated from the solar cell SC may be maximized.

Figure 6:
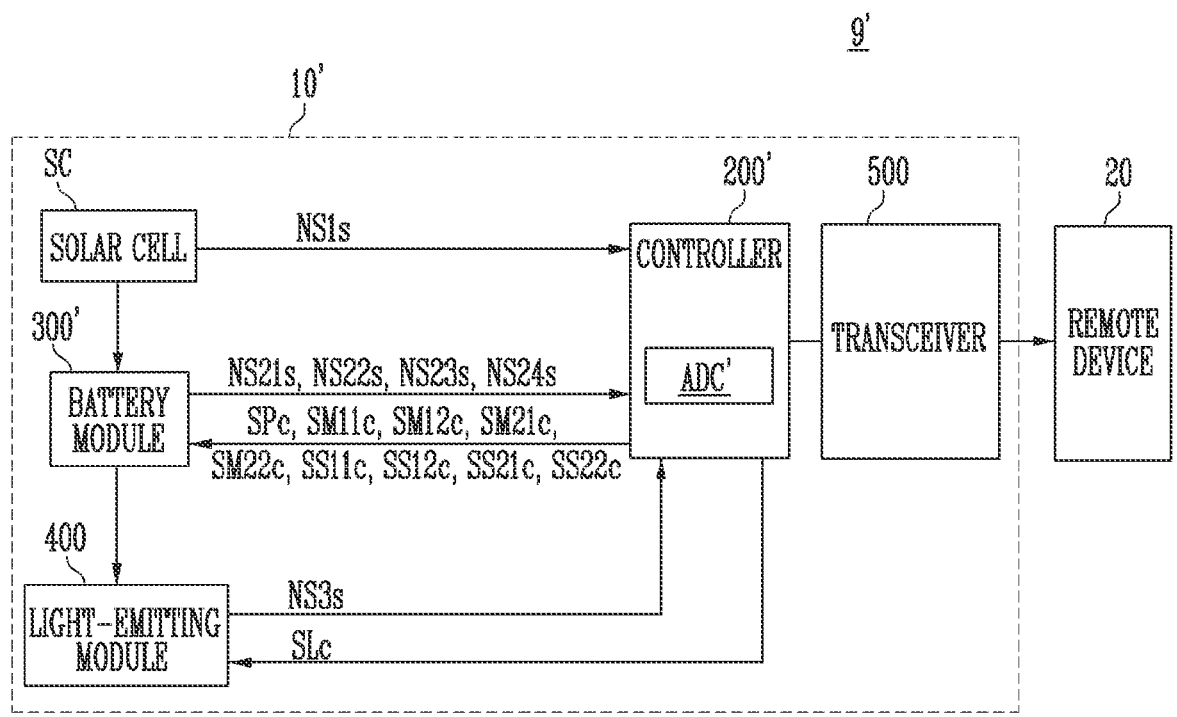
FIG. 6 is a diagram for describing a predictive diagnosis system including a light-emitting sign device according to another embodiment of the present invention.

FIG. 6 is a diagram for describing a predictive diagnosis system including a light-emitting sign device according to another embodiment of the present invention.

FIG. 6 illustrates signals between the battery module 300' of FIG. 5 and a controller 200', which may be changed due to the difference in configuration between the battery module 300' according to the embodiment of FIG. 5 and the battery module 300 of FIG. 3. A description of other redundant components will be omitted here.

The controller 200' may be, for example, a microcontroller unit and may include an analog-to-digital converter ADC' therein.

The analog-to-digital converter ADC' may be connected to a first sensing node NS1 through a first sensing line and connected to second sensing nodes NS21, NS22 NS23, and NS24, which are located between corresponding second resistors R21a, R21b, R22a, R22b, R23a, R23b, R24a and R24b, through second sensing lines. The analog-to-digital converter ADC' may also be connected to a third sensing node NS3 corresponding to a non-ground electrode of a third resistor R3 through a third sensing line.

The analog-to-digital converter ADC' may receive a first sensing signal NS1$s$ corresponding to a solar cell voltage through the first sensing line and receive second sensing signals NS21$s$, NS22$s$, NS23$s$, and NS24$s$ corresponding to battery voltages through the second sensing lines. In addition, the analog-to-digital converter ADC' may receive a third sensing signal NS3$s$ corresponding to a voltage of the third sensing node NS3 through the third sensing line.

The controller 200' may calculate solar cell voltages using a digital conversion value of the first sensing signal NS1$s$ and calculate battery voltages using digital conversion values of the second sensing signals NS21s, NS22s, NS23s and NS24s. In addition, the controller 200' may calculate a driving current of a light-emitting element LED by using a digital conversion value of the third sensing signal NS3s.

The controller 200' may transmit control signals SPc, SM11c, SM12c, SM21c, SM22c, SS11c, SS12c, SS21c and SS22c for controlling the path determination switch SP and the charge/discharge switches SM11, SM12, SM21, SM22, SS11, SS12, SS21 and SS22 to be turned on or off to the battery module 300'. In addition, the controller 200' may transmit a control signal SLc for controlling the emission control transistor SL to a light-emitting module 400.

Effects of the above-described configuration are as described above with reference to FIG. 4.

Figure 7:
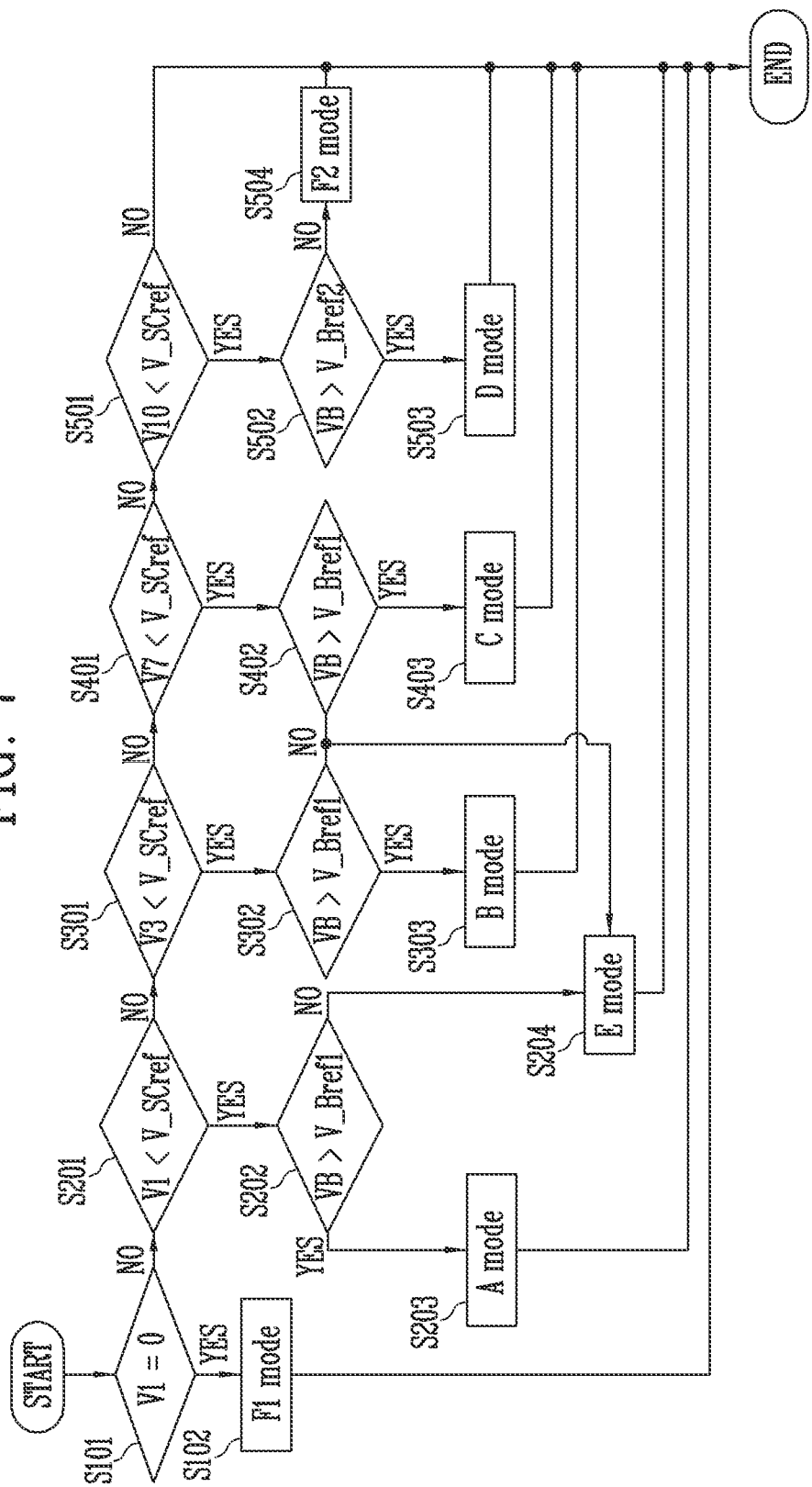
FIG. 7 is a diagram for describing a predictive diagnosis algorithm according to an embodiment of the present invention.

FIG. 7 is a diagram for describing a predictive diagnosis algorithm according to an embodiment of the present invention. FIG. 8 is a diagram for describing driving modes according to an embodiment of the present invention.

For convenience of description, FIGS. 7 and 8 will be described on the basis of the embodiments of FIGS. 3 and 4 but the following description may also apply to the embodiments of FIGS. 5 and 6.

Referring to FIG. 7, an example of a process in which the controller 200 determines one of driving modes A, B, C, D, E, F1, and F2 as a target mode according to a predictive diagnosis algorithm is illustrated.

Referring to FIG. 8, it can be seen that the amounts of power to be supplied to a light-emitting module in driving modes are different. In a table of FIG. 8, when a reference brightness value is 100%, power supply ratios are calculated by adding products of brightness values and corresponding times. For example, a power supply ratio in the driving mode A was calculated by Equation 1 below.

$$15 = 1*1.5 + 3*1 + 3*1 + 4*1 + 2*1 + 1*1.5$$ [Equation 1]

Supply power ratios in other driving modes B, C, D, E, F1, and F2 were also calculated in the same manner and thus are not redundantly described here.

Driving modes may include first driving modes A, B, C, and E and second driving modes D and F2. The controller 200 may measure solar cell voltages for a certain period and calculate an average value of the solar cell voltages. The first driving modes A, B, C, and E may be driving modes determined as target modes when the certain period is less than a reference period and average values V1, V3, and V7 are less than a solar cell reference voltage V_SCref. The second driving modes D and F2 may be driving modes determined as target modes when the certain period is greater than or equal to the reference period and an average value V10 is less than the solar cell reference voltage V_SCref.

The reference period may be set to a value empirically determined to indicate that the amount of sunshine at a place where the light-emitting sign device 10 is installed is insufficient when the predictive diagnosis algorithm of the present embodiment is used. The reference period may be, for example, eight or nine days but may vary according to a product. The reference period may be set appropriately according to a product.

The average value V1 may refer to an average value of solar cell voltages measured for one day. The average value V3 may refer to an average value of solar cell voltages measured for three days. The average value V7 may refer to an average value of solar cell voltages measured for seven days. The average value V10 may refer to an average value of solar cell voltages measured for ten days. In this case, the solar cell voltages may be measured only during the day. In the present embodiment, only one of the average values V1, V3, V7, and V10 may be an effective value, and the other average values that are not effective values may be processed as not satisfying the corresponding conditions S101, S201, S301, S401, and S501.

The solar cell reference voltage V_SCref may be set to an average daily solar cell voltage when the amount of sunshine is normal. The solar cell reference voltage V_SCref may be, for example, 15 V but may vary according to specifications of the solar cell SC.

The first driving modes A, B, C, and E may include a battery overdischarge mode E determined as a target mode when a battery voltage VB is less than or equal to a first battery reference voltage V_Bref1. The driving modes A, B, and C among the first driving modes A, B, C, and E, except the battery overdischarge mode E, may be set to supply less power to the light-emitting module 400 as a corresponding certain period becomes longer but may be set to supply more power to the light-emitting module 400 than the battery overdischarge mode E (S201, S202, S203, S204, S301, S302, S303, S401, S402, and S403).

The second driving modes D and F2 may include an insufficient sunshine mode F2 determined as a target mode when the battery voltage VB is less than or equal to a second battery reference voltage V_Bref2. The second battery reference voltage V_Bref2 may be lower than the first battery reference voltage V_Bref1. The second driving mode D among the second driving modes D and F2, except the insufficient sunshine mode F2, may be set to supply more power to the light-emitting module 400 than the insufficient sunshine mode F2 (S501, S502, S503, and S504).

The first battery reference voltage V_Bref1 may be a voltage when a battery charge of the battery MB1 is approximately 50% to 90%. The second battery reference voltage V_Bref2 may be a voltage when the battery charge of the battery MB1 is approximately 50%. For example, the first battery reference voltage V_Bref1 may be 12 V and the second battery reference voltage V_Bref2 may be 11 V but may vary according to the specifications of the battery MB1.

In one embodiment, when the average value V1 of the solar cell voltages is 0, the controller 200 may apply the third driving mode F1 as a target driving mode to the light-emitting module 400 rather than the driving modes A, B, C, D, E, and F2 described above regardless of the battery voltage VB. In this case, the third driving mode F1 may be a solar cell failure mode (S101 and S102).

The transceiver 500 may transmit a battery overdischarge notification to the remote device 20 when the battery overdischarge mode E is determined as a target mode. A user may check the battery overdischarge notification through the remote device 20 and manually charge the battery MB1 of the light-emitting sign device 10 or perform other chemical treatment to prevent a failure of the battery MB1 or a reduction of the lifetime thereof.

The transceiver 500 may transmit an insufficient sunshine amount notification to the remote device 20 when the insufficient sunshine mode F2 is determined as a target mode. A user may check the insufficient sunshine amount notification through the remote device 20 and take measures to move the light-emitting sign device 10 to an area with a sufficient sunshine amount (e.g., an area that is not shaded), thereby preventing a failure of the battery MB1 or a reduction of the lifetime thereof.

The transceiver 500 may transmit a solar cell failure notification to the remote device 20 when the third driving mode (solar cell failure mode) is determined as a target mode. A user may check the solar cell failure notification through the remote device 20 and fasten a connection jack of the solar cell SC when the connection jack of the solar cell SC is not fastened. In addition, when a failure of the solar cell SC is identified, the solar cell SC may be replaced. Accordingly, a failure of or a reduction of the lifetime of the battery MB1 may be prevented.

Figure 9:
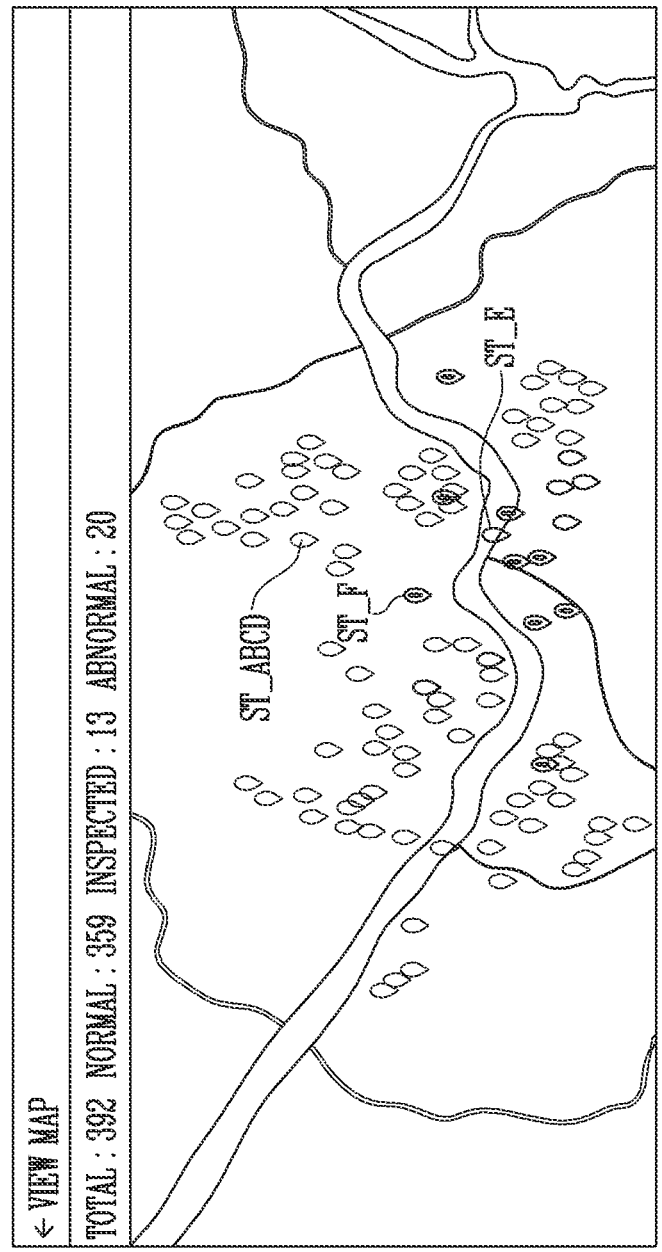
FIGS. 9 and 10 are diagrams for describing a remote device according to an embodiment of the present invention.
Figure 10:
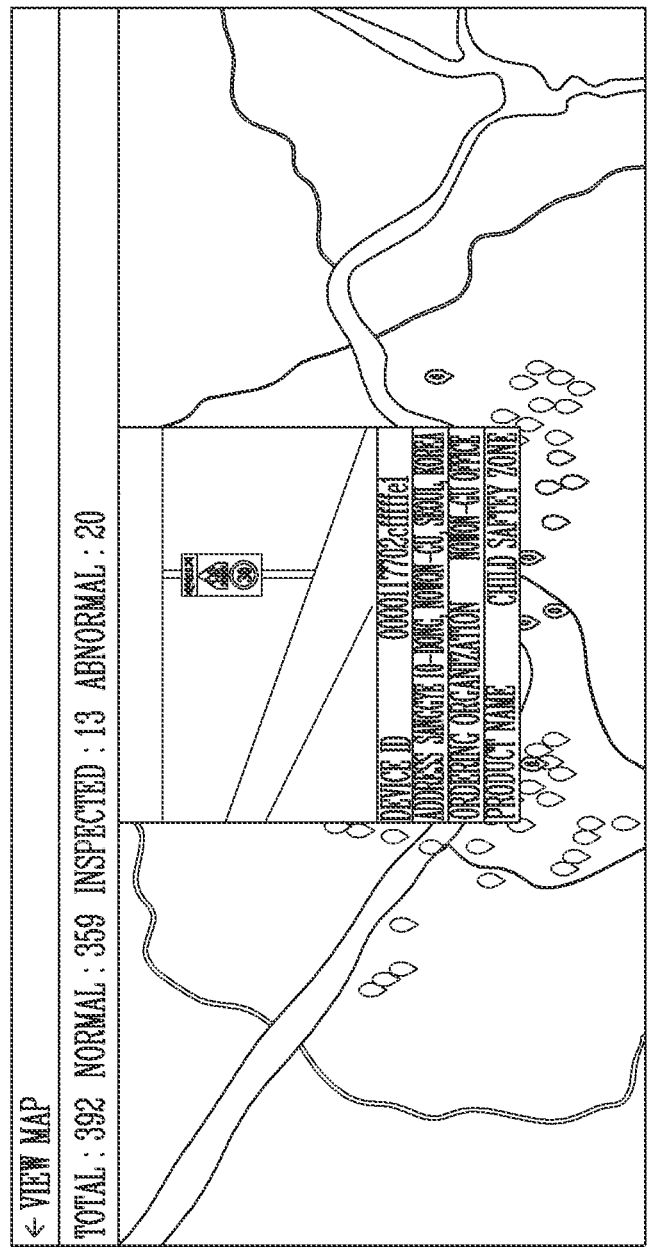

FIGS. 9 and 10 are diagrams for describing a remote device according to an embodiment of the present invention.

FIGS. 9 and 10 illustrate examples of a screen on a monitor that a user may view when the remote device 20 is a desktop computer.

For example, 392 light-emitting sign devices 10 may be displayed on a map. 359 light-emitting sign devices 10 determined to be in normal states A, B, C, and D may be displayed as icons ST_ABCD on the map. Thirteen light-emitting sign devices 10, which are in the battery overdischarge mode E and thus are determined as needing to be inspected, may be displayed as icons ST_E on the map. Twenty light-emitting sign devices 10 that are in the solar cell failure mode F1 or the insufficient sunshine mode F2 and thus are determined to need immediate measures due to abnormality may be displayed as icons ST_F on the map. In another embodiment, the driving mode D may also be displayed as the icon ST_E on the map. There may be various examples of icons according to an embodiment that may be displayed.

When a user clicks the icon ST_ABCD, ST_E or ST_F of the light-emitting sign device 10 of information about which a user wants to view, a popup window as illustrated in FIG. 10 may be generated.

Figure 11:
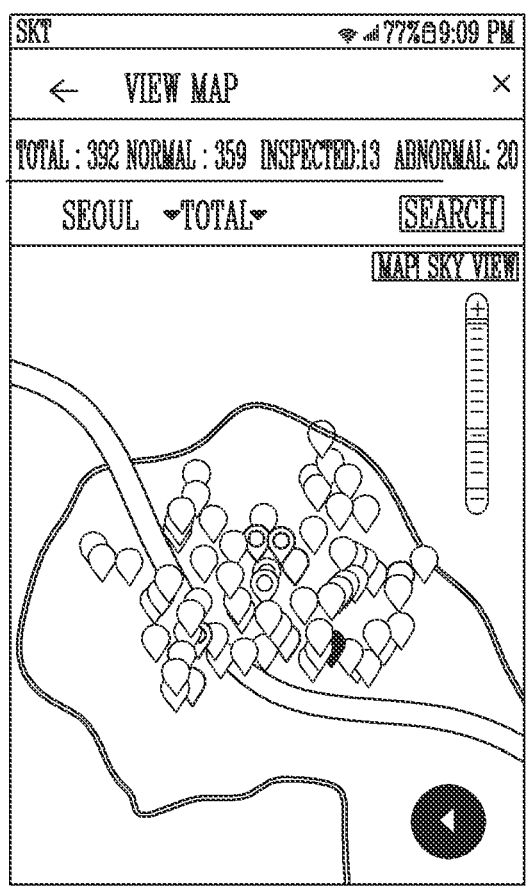
Figure 12:
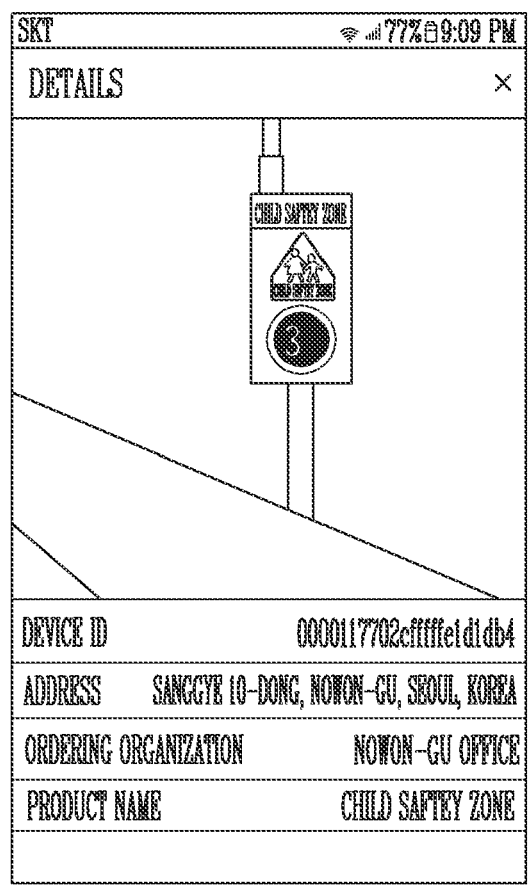

FIGS. 11 to 13 are views for describing a remote device according to another embodiment of the present invention.

Referring to FIGS. 11 to 13, when the remote device 20 is a mobile device, a screen on the mobile device that a user may view is illustrated as an example. Compared with the embodiments of FIGS. 9 and 10, it is necessary to display the same or similar information on a smaller screen and thus a layout is changed.

Referring to FIG. 13, solar cell voltages measured over time are displayed in a "solar" column, battery voltages are displayed in a "battery" column, and the amounts of current consumed by a light-emitting element LED are displayed in a "current consumption" column.

The above-described drawings and the detailed description of the present invention are intended to provide examples of the present invention and are used only for the purpose of describing the present invention and not for purposes of limitation of the scope of the present invention defined in the claims. Therefore, it will be obvious to those of ordinary skill in the art that various modifications and equivalent other embodiments may be made therein. Therefore, the scope of the present invention should be defined by the technical scope defined in the appended claims.

The invention claimed is:

1. A light-emitting sign device comprising:
a solar cell;
a battery module including at least one battery for storing power generated from the solar cell;
a light-emitting module configured to emit light from power supplied from the battery;
a front panel optically coupled to the light-emitting module; and
a controller configured to apply, to the light-emitting module, a target mode determined on a basis of an average value of solar cell voltages of the solar cell measured for a certain period and a voltage value of a battery voltage of the battery module measured at a certain point of time, among driving modes.

2. The light-emitting sign device of claim 1, wherein amounts of power supplied to the light-emitting module are different from each other according to the driving modes.

3. The light-emitting sign device of claim 2, further comprising a transceiver configured to transmit a predictive diagnosis signal corresponding to the target mode to a remote device.

4. The light-emitting sign device of claim 3, wherein the driving modes comprise first driving modes and second driving modes,
wherein the first driving modes are driving modes determined as the target mode when the certain period is less than a reference period and the average value is less than a solar cell reference voltage value, and
the second driving modes are driving modes determined as the target mode when the certain period is equal to or greater than the reference period and the average value is less than the solar cell reference voltage value.

5. The light-emitting sign device of claim 4, wherein the first driving modes comprise a battery overdischarge mode determined as the target mode when the voltage value of the battery voltage is less than or equal to a first battery reference voltage value, and
remaining driving modes among the first driving modes, except the battery overdischarge mode, are set to supply less power to the light-emitting module as the certain period corresponding thereto increases and supply more power to the light-emitting module than the battery overdischarge mode.

6. The light-emitting sign device of claim 5, wherein the second driving modes comprise an insufficient sunshine mode determined as the target mode when the voltage value of the battery voltage is less than or equal to a second battery reference voltage value,
the second battery reference voltage value is lower than the first battery reference voltage value, and
remaining driving modes among the second driving modes, except the insufficient sunshine mode, are set to supply more power to the light-emitting module than the insufficient sunshine mode.

7. The light-emitting sign device of claim 6, wherein, when the average value of the solar cell voltages is zero, the controller applies a third driving mode, which is different from the driving modes, as the target mode to the light-emitting module regardless of the voltage value of the battery voltage.

8. The light-emitting sign device of claim 7, wherein the predictive diagnosis signal comprises at least one of a battery overdischarge notification, an insufficient sunshine amount notification, and a solar cell failure notification,
wherein the battery overdischarge notification is transmitted to the remote device when the battery overdischarge mode is determined as the target mode,
the insufficient sunshine amount notification is transmitted to the remote device when the insufficient sunshine mode is determined as the target mode, and
the solar cell failure notification is transmitted to the remote device when the third driving mode is determined as the target mode.

9. The light-emitting sign device of claim 1, further comprising:
a first resistor connected to be parallel to the solar cell; and
a second resistor connected to be parallel to the battery, wherein the controller comprises an analog-to-digital converter therein, wherein the analog-to-digital converter is connected to one end of the first resistor connected to a positive electrode of the solar cell through a first sensing line and connected to one end of the second resistor connected to a positive electrode of the battery through a second sensing line.

10. The light-emitting sign device of claim 9, wherein the controller calculates the solar cell voltages using a digital conversion value of an analog voltage sensed by the first sensing line and calculates the battery voltage using a digital conversion value of an analog voltage sensed by the second sensing line.

11. The light-emitting sign device of claim 10, wherein the light-emitting module comprises a light-emitting element, an emission control transistor, and a third resistor which are connected in series, and the analog-to-digital converter is connected to a non-ground electrode of the third resistor through a third sensing line.

12. The light-emitting sign device of claim 11, wherein the controller calculates a driving current of the light-emitting element using a digital conversion value of an analog voltage sensed by the third sensing line.

13. The light-emitting sign device of claim 12, further comprising a transceiver configured to transmit values of the solar cell voltages, the battery voltage, and the driving current to a remote device.

14. A light-emitting sign device comprising:

a solar cell;

a battery module including at least one battery for storing power generated from the solar cell;

a light-emitting nodule configured to emit light from power output from the battery;

a front panel optically coupled to the light-emitting module; and a controller comprising an analog-to-digital converter therein, wherein the light-emitting module comprises a light-emitting element, an emission control transistor, and a resistor which are connected in series, and the analog-to-digital converter is connected to a non-ground electrode of the resistor through a sensing line.

15. The light-emitting sign device of claim 14, wherein the controller calculates a driving current of the light-emitting element using a digital output value of an analog voltage sensed by the sensing line.

* * * * *